(12) United States Patent
Moon et al.

(10) Patent No.: US 9,627,126 B2
(45) Date of Patent: Apr. 18, 2017

(54) PRINTED CIRCUIT BOARD INCLUDING INDUCTOR

(71) Applicant: SAMSUNG ELECTRONICS CO., LTD., Suwon-si, Gyeonggi-do (KR)

(72) Inventors: Hyun-Jong Moon, Seoul (KR); Bok-Sik Myung, Seongnam-si (KR); Seong-Ho Shin, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 352 days.

(21) Appl. No.: 14/255,237

(22) Filed: Apr. 17, 2014

(65) Prior Publication Data
US 2014/0362551 A1   Dec. 11, 2014

(30) Foreign Application Priority Data

Jun. 5, 2013 (KR) .................. 10-2013-0064746

(51) Int. Cl.
| | |
|---|---|
| *H05K 1/18* | (2006.01) |
| *H01F 27/28* | (2006.01) |
| *H05K 1/16* | (2006.01) |
| *H05K 1/02* | (2006.01) |

(52) U.S. Cl.
CPC ......... *H01F 27/2804* (2013.01); *H05K 1/024* (2013.01); *H05K 1/165* (2013.01); *H01F 2027/2809* (2013.01); *H05K 1/0298* (2013.01)

(58) Field of Classification Search
CPC ........ H05K 1/162; H05K 1/167; H05K 1/111; H05K 1/141; H01L 2924/01078–2924/01079

USPC .............. 361/760–766, 792–795, 782–784; 174/257–264

See application file for complete search history.

(56) References Cited

U.S. PATENT DOCUMENTS

| | | | | |
|---|---|---|---|---|
| 5,929,510 | A * | 7/1999 | Geller | ..................... H01L 23/66 257/635 |
| 6,740,411 | B2 * | 5/2004 | Kojima | ................. H01L 21/568 257/E23.062 |
| 7,170,384 | B2 | 1/2007 | Kim et al. | |
| 7,212,095 | B2 | 5/2007 | Sato et al. | |
| 7,339,452 | B2 | 3/2008 | Lee | |
| 7,504,922 | B2 | 3/2009 | Lee | |

(Continued)

FOREIGN PATENT DOCUMENTS

| | | |
|---|---|---|
| JP | 2005-183646 | 7/2005 |
| JP | 2006-059999 | 3/2006 |

(Continued)

*Primary Examiner* — Tuan T Dinh
(74) *Attorney, Agent, or Firm* — F. Chau & Associates, LLC

(57) ABSTRACT

A printed circuit board (PCB) includes an insulating substrate, a plurality of copper foil pattern layers and a plurality of insulating adhesive sheets sequentially stacked on an upper side of the insulating substrate and a lower side of the insulating substrate, an inductor included in the copper foil pattern layer disposed on the upper side of the insulating substrate, a grounding element included in the copper foil pattern layer disposed on the lower side of the insulating substrate, and a single through hole penetrating the insulating substrate and the insulating adhesive sheets. The single through hole is disposed between the inductor and the grounding element.

19 Claims, 19 Drawing Sheets

(56) References Cited

U.S. PATENT DOCUMENTS

| | | | |
|---|---|---|---|
| 7,529,103 B2 | 5/2009 | Chen et al. | |
| 7,599,190 B2 * | 10/2009 | Okubora | H01L 23/49833 |
| | | | 361/760 |
| 7,626,480 B2 | 12/2009 | Lee | |
| 2009/0225525 A1 * | 9/2009 | Mano | H01F 17/0006 |
| | | | 361/760 |
| 2012/0146757 A1 | 6/2012 | Tsai et al. | |

FOREIGN PATENT DOCUMENTS

| | | |
|---|---|---|
| JP | 2009-111261 | 5/2009 |
| KR | 10-0304360 | 6/2000 |
| KR | 10-0688858 | 7/2006 |
| KR | 1020090039483 | 4/2009 |

* cited by examiner

PRINTED CIRCUIT BOARD INCLUDING INDUCTOR

CROSS-REFERENCE TO RELATED APPLICATION

This application claims priority under 35 U.S.C. §119 to Korean Patent Application No. 10-2013-0064746 filed on Jun. 5, 2013, the entire disclosure of which is hereby incorporated by reference herein in its entirety.

TECHNICAL FIELD

Embodiments of the inventive concept relate to a printed circuit board (PCB) including an inductor, and particularly, to a multi-layer printed circuit board (PCB) having a structure which can reduce a parasitic capacitance to increase a Q-value (Q-factor) of an inductor.

DISCUSSION OF RELATED ART

In recent mobile products, there has been a trend of constituting a passive element such as, for example, an inductor, a capacitor, a resistor, etc. in a printed circuit board (PCB) rather than a semiconductor chip for miniaturization as well as a thin and uniform thickness.

PCBs having various interior structures have been proposed which constitute the inductor in the PCB in an attempt to increase a Q-value of the inductor.

SUMMARY

Embodiments of the inventive concept provide a printed circuit board (PCB) having a structure which can minimize a parasitic capacitance to increase a Q-value of an inductor.

Embodiments of the inventive concept also provide a PCB including a through hole which is filled with air between an inductor and a grounding element (e.g., a conductive plate) facing the inductor to reduce a parasitic capacitance.

Embodiments of the inventive concept also provide a PCB including a hollow dielectric with a low dielectric constant between an inductor and a grounding element (e.g., a conductive plate) facing the inductor to reduce a parasitic capacitance.

Embodiments of the inventive concept also provide a PCB including a dielectric with a low dielectric constant between an inductor and a grounding element (e.g., a conductive plate) to reduce a parasitic capacitance.

In accordance with an exemplary embodiment of the inventive concept, a printed circuit board (PCB) includes an insulating substrate, a plurality of copper foil pattern layers and a plurality of insulating adhesive sheets sequentially stacked on an upper side of the insulating substrate and a lower side of the insulating substrate, an inductor included in the copper foil pattern layer disposed on the upper side of the insulating substrate, a grounding element included in the copper foil pattern layer disposed on the lower side of the insulating substrate, and a single through hole penetrating the insulating substrate and the insulating adhesive sheets. The single through hole is disposed between the inductor and the grounding element.

The inductor may include a body having a horseshoe shape, a first connection terminal which is a first end of the body, and a second connection terminal which is a second end of the body.

The single through hole may include air having a dielectric constant of 1.

The insulating substrate may include multi-layer prepregs which is heated and pressurized. The prepreg may include a reinforcing fiber and a thermosetting resin.

In an embodiment, the PCB may further include a single hollow dielectric filling the single through hole, and being hollow therein. The single dielectric may be a low dielectric material including at least one a polyimide resin, a Teflon resin, and a silicone resin having a dielectric constant lower than about 4.3.

In an embodiment, the PCB may further include a single dielectric filling the single through hole. The single dielectric may be a low dielectric material including at least one of a polyimide resin, a Teflon resin, and a silicone resin having a dielectric constant lower than about 4.3.

In accordance with an exemplary embodiment of the inventive concept, a printed circuit board (PCB) includes an insulating substrate, a plurality of copper foil pattern layers and a plurality of insulating adhesive sheets sequentially stacked on an upper side of the insulating substrate and a lower side of the insulating substrate, an inductor included in the copper foil pattern layer disposed on the upper side of the insulating substrate, a grounding element included in the copper foil pattern layer disposed on the lower side of the insulating substrate, a first through hole penetrating an insulating adhesive sheet adjacent to the inductor, and a second through hole penetrating an insulating adhesive sheet adjacent to the grounding element. The first through hole and the second through hole are disposed between the inductor and the grounding element.

The PCB may further include a first hollow dielectric filling the first through hole and having a dielectric constant lower than about 4.3, and a second hollow dielectric filling the second through hole and having the dielectric constant lower than about 4.3.

The PCB may include a first dielectric filling the first through hole and having a dielectric constant lower than about 4.3, and a second dielectric filling the second through hole and having the dielectric constant lower than about 4.3.

In accordance with an exemplary embodiment, a semiconductor package is provided. The semiconductor package includes a printed circuit board (PCB), a semiconductor chip mounted on an upper side of the PCB, a plurality of chip bumps disposed on a lower side of the semiconductor chip, a plurality of upper lands disposed on the upper side of the PCB;
a plurality of lower lands disposed on a lower side of the PCB, and a plurality of solder balls disposed on the lower side of the PCB.

The PCB includes an insulating substrate, a first copper foil pattern layer disposed on an upper side of the insulating substrate, a second copper foil pattern layer disposed on a lower side of the insulating substrate, in which the first copper foil pattern layer and the second copper foil pattern layer include a circuit line layer, a first insulating adhesive sheet disposed on an upper surface of the first copper foil pattern layer, a first insulating layer disposed on an upper surface of the first insulating adhesive sheet, a third copper foil pattern layer disposed on an upper surface of the first insulating layer, in which the third copper foil pattern layer includes the upper lands and an inductor, a second insulating adhesive sheet disposed on a lower surface of the second copper foil pattern layer, a second insulating layer disposed on a lower surface of the second insulating adhesive sheet, and a fourth copper foil pattern layer disposed on a lower surface of the second insulating layer. The fourth copper foil pattern layer includes the lower lands and a grounding element.

In addition, the PCB further includes a single through hole penetrating the insulating substrate and the first insulating adhesive sheet and the second insulating adhesive sheet, in which the single through hole is disposed between the inductor and the grounding element, a first coating layer covering the third copper foil pattern layer, and a second coating layer covering the fourth copper foil pattern layer.

BRIEF DESCRIPTION OF THE DRAWINGS

Exemplary embodiments of the inventive concept can be understood in more detail from the following detailed description taken in conjunction with the attached drawings, in which.

DETAILED DESCRIPTION OF EXEMPLARY EMBODIMENTS

Exemplary embodiments of the present invention are described below in sufficient detail to enable those of ordinary skill in the art to embody and practice exemplary embodiments present invention. It is important to understand that exemplary embodiments of the present invention may be embodied in many alternate forms and should not be construed as limited to exemplary embodiments set forth herein.

It will be understood that when an element is referred to as being "connected" or "coupled" to another element, it can be directly connected or coupled to the other element or intervening elements may be present. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Figure 1A:
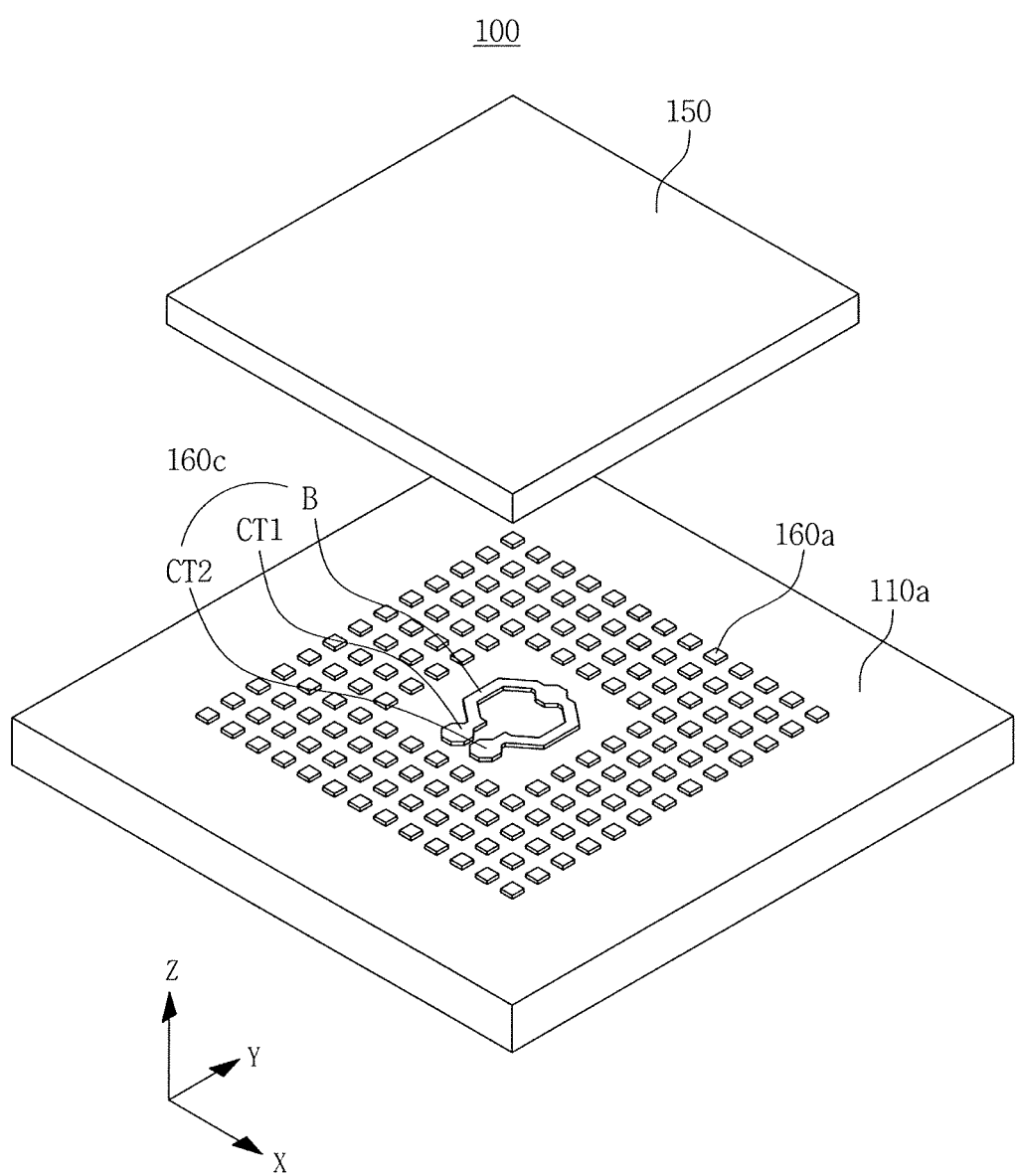
FIG. 1A is a perspective view of a semiconductor package including a printed circuit board (PCB) according to an embodiment of the inventive concept.
Figure 1B:
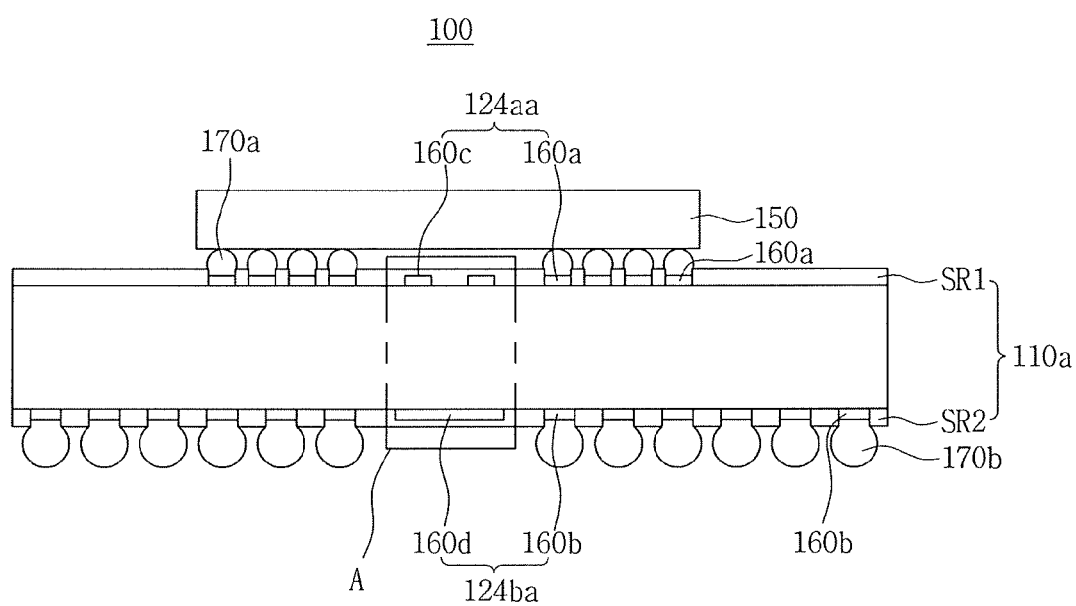
FIG. 1B is a sectional view taken in an x-axis direction of FIG. 1A.
Figure 1C:
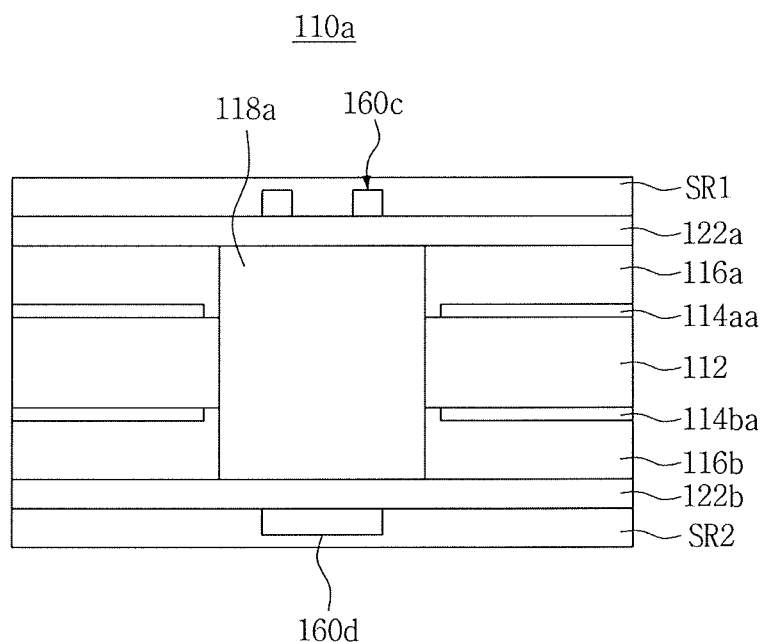
FIG. 1C is a sectional view illustrating a PCB according to an embodiment of the inventive concept, and an enlarged view of part "A" of FIG. 1B.

FIG. 1A is a perspective view of a semiconductor package including a printed circuit board (PCB) according to an embodiment of the inventive concept, FIG. 1B is a sectional view taken in an x-axis direction of FIG. 1A, and FIG. 1C is an enlarged view of part "A" of FIG. 1B.

Referring to FIG. 1A and FIG. 1B, a semiconductor package 100 including a multi-layer printed circuit board (PCB) 110a according to an embodiment of the inventive concept may include a semiconductor chip 150 mounted on an upper side of the PCB 110a, chip bumps 170a attached to a lower side of the semiconductor chip 150, upper lands 160a formed on the upper side of the PCB 110a, and lower lands 160b and solder balls 170b formed on a lower side of the PCB 110a.

Referring to FIGS. 1B and 1C, the PCB 110a may include, for example, an insulating substrate 112, a first copper foil pattern layer 114aa, a second copper foil pattern layer 114ba, a first insulating adhesive sheet 116a, a second insulating adhesive sheet 116b, a first insulating layer 122a, a second insulating layer 122b, a third copper foil pattern layer 124aa, and a fourth copper foil pattern layer 124ba.

The PCB 110a may include, for example, a single through hole 118a vertically penetrating the first insulating adhesive sheet 116a, the insulating substrate 112, and the second insulating adhesive sheet 116b. Additionally, the PCB 110a may further include, for example, a first coating layer SR1 and a second coating layer SR2 covering the third copper foil pattern layer 124aa and the fourth copper foil pattern layer 124ba, respectively.

The first copper foil pattern layer 114aa may be formed on an upper side of the insulating substrate 112, and the second copper foil pattern layer 114ba may be formed on a lower side of the insulating substrate 112. The first insulating adhesive sheet 116a, the first insulating layer 122a, and the third copper foil pattern layer 124aa may be stacked on an upper side of the first copper foil pattern layer 114aa, and the second insulating adhesive sheet 116b, the second insulating layer 122b, and the fourth copper foil pattern layer 124ba may be stacked on a lower side of the second copper foil pattern layer 114ba.

The insulating substrate 112, the first insulating adhesive sheet 116a, and the second insulating adhesive sheet 116b may include, for example, a prepreg, and the first insulating layer 122a and the second insulating layer 122b may include, for example, a prepreg or a polyimide film. The prepreg may include, for example, a reinforcing fiber and a thermosetting resin. The reinforcing fiber may include, for example, a carbon fiber, a glass fiber, and an aramid fiber. The thermosetting resin may include, for example, an epoxy resin, a phenolic resin, a polyester resin, and so on.

The insulating substrate 112, the first insulating adhesive sheet 116a, and the second insulating adhesive sheet 116b may be formed by, for example, heating and pressurizing a prepreg of a B-stage. For example, the insulating substrate 112 may be formed by heating and pressurizing several sheets of prepreg.

The first copper foil pattern layer 114aa and the second copper foil pattern layer 114ba may include, for example, a circuit line layer. The third copper foil pattern layer 124aa may include, for example, a signal line, the upper lands 160a, and an inductor 160c. The fourth copper foil pattern layer 124ba may include, for example, the lower lands 160b and a grounding element 160d (e.g., a conductive plate).

Referring to FIG. 1A, the inductor 160c may include, for example, a body B having a horseshoe shape, a first connection terminal CT1 which is one end of the body B, and a second connection terminal CT2 which is the other end of the body B. The first connection terminal CT1 and the second connection terminal CT2 of the inductor 160c may be electrically connected to sides of the upper lands 160a, or a signal line inside the PCB 110a through a via. The ground means 160d may have, for example, the same shape as the inductor 160c, or a plate shape.

Referring to FIG. 1C, the single through hole 118a may be located between the inductor 160c and the grounding element 160d. The interior of the single through hole 118a may be filled with, for example, air.

As described above, the PCB 110a according to an embodiment of the inventive concept may include the single through hole 118a filled with air having a dielectric constant of 1 between the inductor 160c and the grounding element 160d. This structure may reduce capacitance of a parasitic capacitor which forms an electrically equivalent circuit with the inductor 160c.

In this case, a value of a Q-factor which can determine characteristics of the inductor 160c may be increased. Accordingly, the characteristics of the inductor 160c may be increased.

Figure 2:
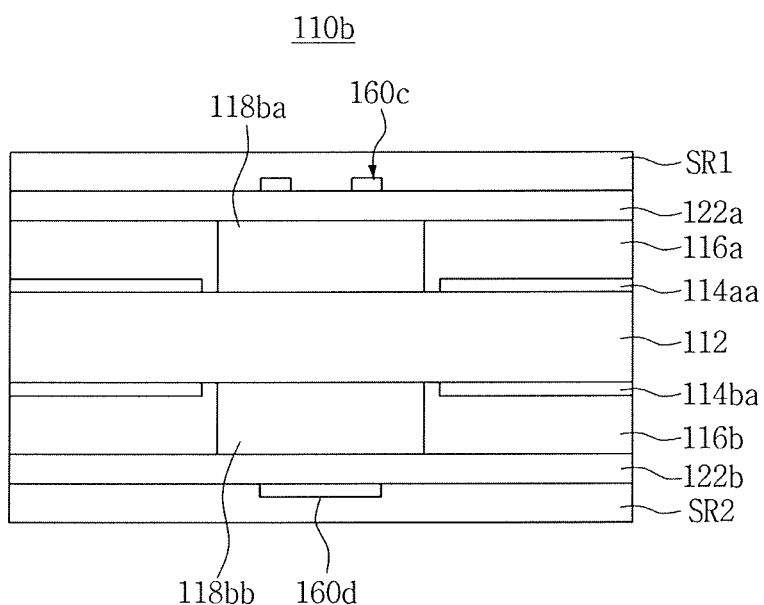
FIG. 2 is a sectional view illustrating a PCB according to an embodiment of the inventive concept, and an enlarged view of part "A" of FIG. 1B.

FIG. 2 is a sectional view illustrating a PCB according to an embodiment of the inventive concept, and an enlarged view of part "A" of FIG. 1B. A detailed description of the PCB according to an embodiment of the inventive concept will be explained with further reference to FIG. 1B hereinafter.

Referring to FIG. 2 and FIG. 1B, the PCB 110b according to an embodiment of the inventive concept may include, for example, an insulating substrate 112, a first copper foil pattern layer 114aa, a second copper foil pattern layer 114ba, a first insulating adhesive sheet 116a, a second insulating adhesive sheet 116b, a first insulating layer 122a, a second insulating layer 122b, a third copper foil pattern layer 124aa, a fourth copper foil pattern layer 124ba, a first coating layer SR1, and a second coating layer SR2.

The third copper foil pattern layer 124aa may include, for example, a signal line, upper lands 160a, and an inductor 160c. The fourth copper foil pattern layer 124ba may include, for example, lower lands 160b and a grounding element 160d.

Further, the PCB 110b according an embodiment of the inventive concept may include, for example, a first through hole 118ba and a second through hole 118bb penetrating the first insulating adhesive sheet 116a and the second insulating adhesive layer 116b, respectively.

The first through hole 118ba and the second through hole 118bb may, for example, be vertically formed in the top and bottom, and located between the inductor 160c and the grounding element 160d. The first through hole 118ba and the second through hole 118bb may include, for example, air having a dielectric constant of 1.

Figure 3:
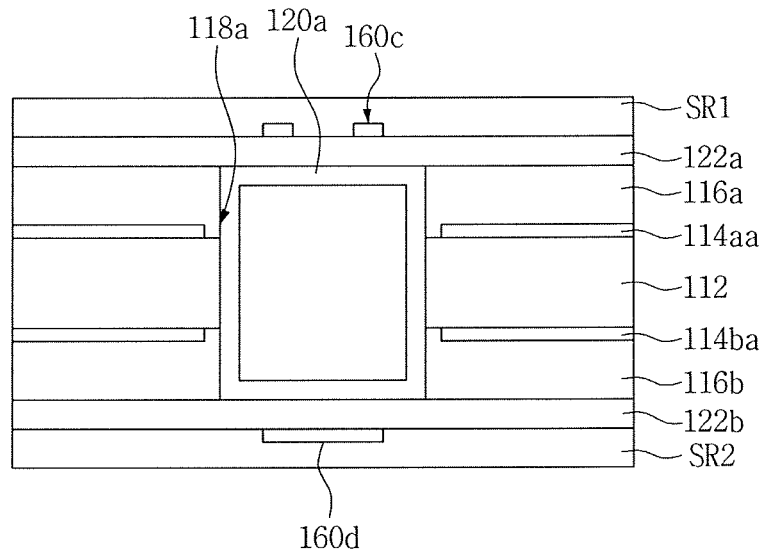
FIG. 3 is a sectional view illustrating a PCB according to an embodiment of the inventive concept, and an enlarged view of part "A" of FIG. 1B.

FIG. 3 is a sectional view illustrating a PCB according to an embodiment of the inventive concept, and an enlarged view of part "A" of FIG. 1B. A detailed description of the PCB according to an embodiment of the inventive concept will be explained with further reference to FIG. 1B hereinafter.

Referring to FIG. 3 and FIG. 1B, the PCB 110c according to an embodiment of the inventive concept may include, for example, an insulating substrate 112, a first copper foil pattern layer 114aa, a second copper foil pattern layer 114ba, a first insulating adhesive sheet 116a, a second insulating adhesive sheet 116b, a first insulating layer 122a, a second insulating layer 122b, a third copper foil pattern layer 124aa, a fourth copper foil pattern layer 124ba, a first coating layer SR1, and a second coating layer SR2.

The third copper foil pattern layer 124aa may include, for example, a signal line, upper lands 160a, and an inductor 160c. The fourth copper foil pattern layer 124ba may include, for example, lower lands 160b and a grounding element 160d.

Further, the PCB 110c according to an embodiment of the inventive concept may include, for example, a single through hole 118a penetrating the first insulating adhesive sheet 116a, the insulating substrate 112, the second insulating adhesive sheet 116b, and a single hollow dielectric 120a which fills the single through hole 118a and whose interior is in a hollow state.

The interior of the single hollow dielectric 120a may be filled with, for example, air having a dielectric constant of 1. After the single hollow dielectric 120a is separately formed, the single hollow dielectric 120a may be filled inside the single through hole 118a. The single hollow dielectric 120a may be located between the inductor 160c and the grounding element 160d.

An upper side of the single hollow dielectric 120a may be, for example, at a same level or a lower level than an upper side of the first insulating adhesive sheet 116a. A lower side of the single hollow dielectric 120a may be, for example, at a same level or a lower level than a lower side of the second insulating adhesive sheet 116b.

The single hollow dielectric 120a may include, for example, a low dielectric material which has a dielectric constant lower than about 4.3 and is moldable in a uniform shape. The low dielectric material may include, for example, a polyimide resin, a Teflon resin, a silicone resin, and so on.

Figure 4:
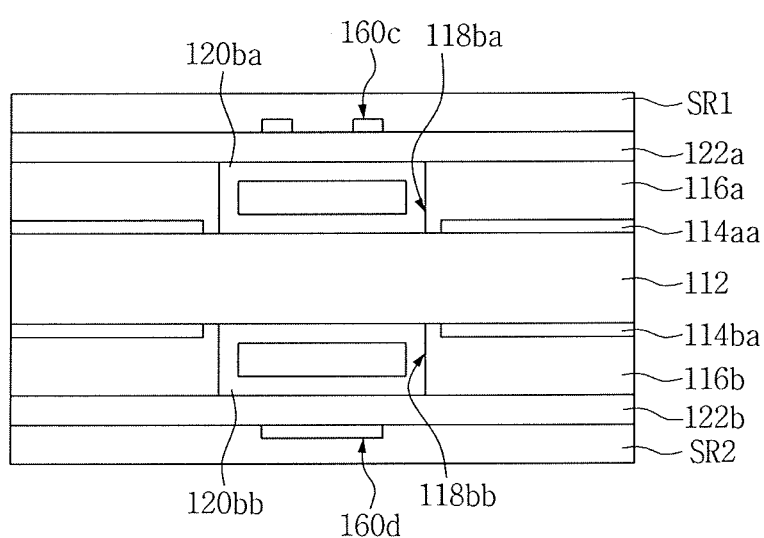
FIG. 4 is a sectional view illustrating a PCB according to an embodiment of the inventive concept, and an enlarged view of part "A" of FIG. 1B.

FIG. 4 is a sectional view illustrating a PCB according to an embodiment of the inventive concept, and an enlarged view of part "A" of FIG. 1B. A detailed description of the PCB according to an embodiment of the inventive concept will be explained with further reference to FIG. 1B hereinafter.

Referring to FIG. 4 and FIG. 1B, a PCB 110d according to an embodiment of the inventive concept may include, for example, an insulating substrate 112, a first copper foil pattern layer 114aa, a second copper foil pattern layer 114ba, a first insulating adhesive sheet 116a, a second insulating adhesive sheet 116b, a first insulating layer 122a, a second insulating layer 122b, a third copper foil pattern layer 124aa, a fourth copper foil pattern layer 124ba, a first coating layer SR1, and a second coating layer SR2.

The third copper foil pattern layer 124aa may include, for example, a signal line, upper lands 160a, and an inductor 160c. The fourth copper foil pattern layer 124ba may include, for example, lower lands 160b and a grounding element 160d.

The PCB 110d according to an embodiment of the inventive concept may include, for example, a first through hole 118ba and a second through hole 118bb penetrating the first insulating adhesive sheet 116a and the second insulating adhesive sheet 116b, respectively, a first hollow dielectric 120ba filling the first through hole 118ba, and a second hollow dielectric 120bb filling the second through hole 118bb.

Air may, for example, be filled inside the first hollow dielectric 120ba and the second hollow dielectric 120bb. After the first hollow dielectric 120ba and the second hollow dielectric 120bb are separately formed, the first hollow dielectric 120ba and the second hollow dielectric 120bb may be filled inside the first through hole 118ba and the second through hole 118bb, respectively. The first hollow dielectric 120ba and the second hollow dielectric 120bb may, for example, be vertically formed in the top and bottom, and located between the inductor 160c and the grounding element 160d.

An upper side of the first hollow dielectric 120ba may be, for example, at a same level or a lower level than an upper side of the first insulating adhesive sheet 116a. A lower side of the second hollow dielectric 120bb may be, for example, at a same level or a lower level than a lower side of the second insulating adhesive sheet 116b.

The first hollow dielectric 120ba and the second hollow dielectric 120bb may include, for example, a low dielectric material which has a dielectric constant lower than about 4.3. The low dielectric material may include, for example, a polyimide resin, a Teflon resin, a silicone resin, and so on.

Figure 5:
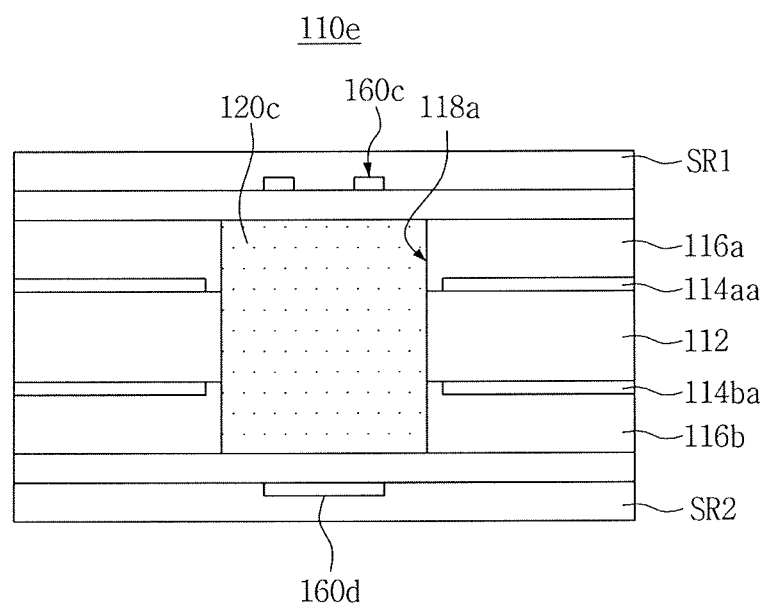
FIG. 5 is a sectional view illustrating a PCB according to an embodiment of the inventive concept, and an enlarged view of part "A" of FIG. 1B.

FIG. 5 is a sectional view illustrating a PCB according to an embodiment of the inventive concept, and an enlarged view of part "A" of FIG. 1B. A detailed description of the PCB according to an embodiment of the inventive concept will be explained with further reference to FIG. 1B hereinafter.

Referring to FIG. 5 and FIG. 1B, a PCB 110e according to an embodiment of the inventive concept may include, for example, an insulating substrate 112, a first copper foil pattern layer 114aa, a second copper foil pattern layer 114ba, a first insulating adhesive sheet 116a, a second insulating adhesive sheet 116b, a first insulating layer 122a, a second insulating layer 122b, a third copper foil pattern layer 124aa, a fourth copper foil pattern layer 124ba, a first coating layer SR1, and a second coating layer SR2.

The third copper foil pattern layer 124aa may include, for example, a signal line, upper lands 160a, and an inductor 160c. The fourth copper foil pattern layer 124ba may include, for example, lower lands 160b and a grounding element 160d.

The PCB 110e according to an embodiment of the inventive concept may include, for example, a single through hole 118a vertically penetrating the first insulating adhesive sheet 116a, the insulating substrate 112 and the second insulating adhesive sheet 116b, and a single dielectric 120c filling the single through hole 118a.

The forming of the single dielectric 120c may include, for example, coating with a low dielectric material, and then partially removing the low dielectric material. Therefore, the single dielectric 120c may be formed only inside the single through hole 118a. On the other hand, the single dielectric 120c may be separately formed, and then filled inside the single through hole 118a. The single dielectric 120c may be located between the inductor 160c and the grounding element 160d.

An upper side of the single dielectric 120c may be, for example, at a same level or a lower level than an upper side of the first insulating adhesive sheet 116a. A lower side of the single dielectric 120c may be, for example, at a same level or a lower level than a lower side of the second insulating adhesive sheet 116b.

The single dielectric 120c may include, for example, a low dielectric material which has a dielectric constant lower than about 4.3 and is moldable in a uniform shape. The low dielectric material may include, for example, a polyimide resin, a Teflon resin, a silicone resin, and so on.

Figure 6:
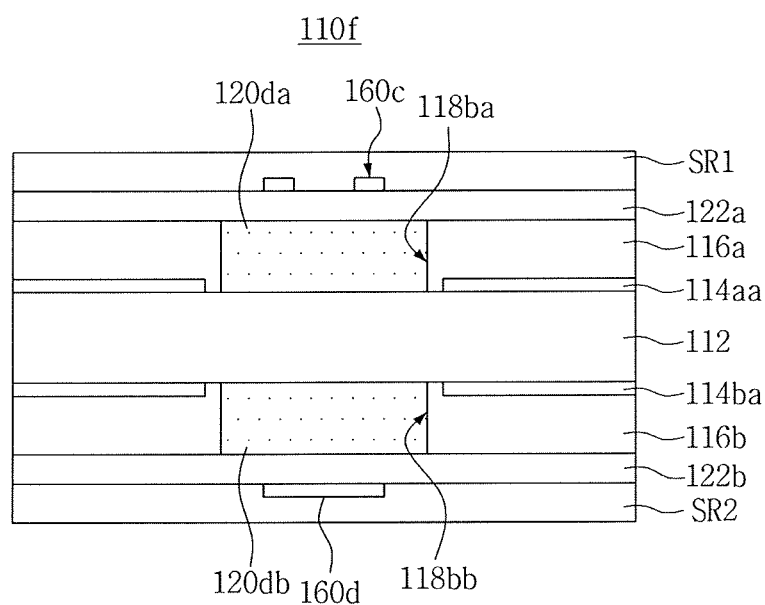
FIG. 6 is a sectional view illustrating a PCB according to an embodiment of the inventive concept, and an enlarged view of part "A" of FIG. 1B.

FIG. 6 is a sectional view illustrating a PCB according to an embodiment of the inventive concept, and an enlarged view of part "A" of FIG. 1B. A detailed description of the PCB according to an embodiment of the inventive concept will be explained with further reference to FIG. 1B hereinafter.

Referring to FIG. 6 and FIG. 1B, a PCB 110f according to an embodiment of the inventive concept may include, for example, an insulating substrate 112, a first copper foil pattern layer 114aa, a second copper foil pattern layer 114ba, a first insulating adhesive sheet 116a, a second insulating adhesive sheet 116b, a first insulating layer 122a, a second insulating layer 122b, a third copper foil pattern layer 124aa, a fourth copper foil pattern layer 124ba, a first coating layer SR1, and a second coating layer SR2.

The third copper foil pattern layer 124aa may include, for example, a signal line, upper lands 160a, and an inductor 160c. The fourth copper foil pattern layer 124ba may include, for example, lower lands 160b and a grounding element 160d.

The PCB 110f according to an embodiment of the inventive concept may include, for example, a first through hole 118ba and a second through hole 118bb vertically penetrating the first insulating adhesive sheet 116a and the second insulating adhesive sheet 116b, respectively, a first dielectric 120da filling the first through hole 118ba, and a second dielectric 120db filling the second through hole 118bb.

Forming the first dielectric 120da and a second dielectric 120db may include, for example, coating with a low dielectric material, and then partially removing the low dielectric material. Therefore, the first dielectric 120da and the second dielectric 120*db* may be filled inside the first through hole 118*ba* and the second through hole 118*bb*, respectively. On the other hand, the first dielectric 120*da* and the second dielectric 120*db* may be individually formed, and then filled inside the first through hole 118*ba* and the second through hole 118*bb*, respectively. The first dielectric 120*da* and the second dielectric 120*db* may be, for example, vertically formed, and located between the inductor 160*c* and the grounding element 160*d*.

An upper side of the first dielectric 120*da* may be, for example, at a same level or a lower level than an upper side of the first insulating adhesive sheet 116*a*. A lower side of the second dielectric 120*db* may be, for example, at a same level or a lower level than a lower side of the second insulating adhesive sheet 116*b*.

The first dielectric 120*da* and the second dielectric 120*db* may include, for example, a low dielectric material which has a dielectric constant lower than about 4.3. The low dielectric material may include, for example, a polyimide resin, a Teflon resin, a silicone resin, and so on.

FIG. 7A to FIG. 7G are sectional views illustrating a method of manufacturing the PCB according to an embodiment of the inventive concept. A detailed description of the method of manufacturing the PCB according to an embodiment of the inventive concept will be explained with further reference to FIG. 1A and FIG. 1B hereinafter.

Figure 7A:
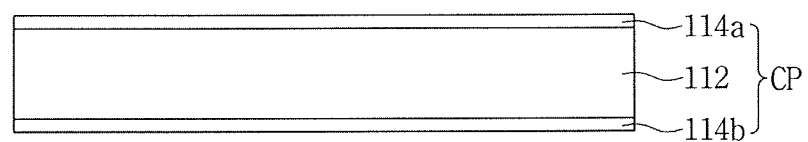
FIG. 7A to FIG. 7G are sectional views illustrating a method of manufacturing a PCB according to an embodiment of the inventive concept.

Referring to FIG. 7A, the method of manufacturing the PCB 110*a* according to the present embodiment of the inventive concept may include preparing a copper clad laminated CP.

The copper clad laminated CP may include, for example, an insulating substrate 112, a first copper foil layer 114*a* attached to an upper side of the insulating substrate 112, and a second copper foil layer 114*b* attached to a lower side of the insulating substrate 112. The insulating substrate 112 may be formed by, for example, heating and pressurizing a plurality of prepregs. The prepregs may include, for example, a reinforcing fiber and a thermosetting resin. The reinforcing fiber may include, for example, a carbon fiber, a glass fiber, and an aramid fiber. The thermosetting resin may include, for example, an epoxy resin, a phenolic resin, a polyester resin, and so on.

Figure 7B:
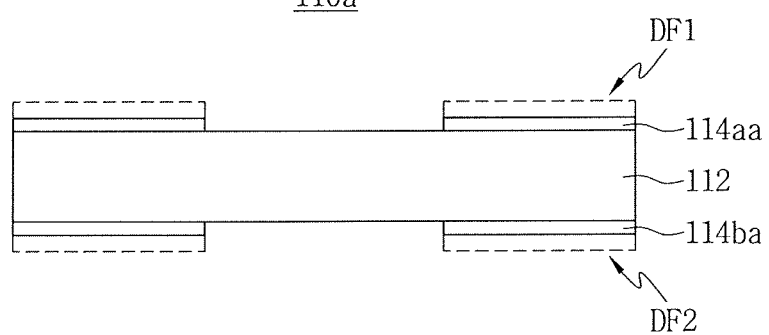

Referring to FIG. 7B, the method of manufacturing the PCB 110*a* according to the present embodiment of the inventive concept may include patterning the first copper foil layer 114*a* and the second copper foil layer 114*b* shown in FIG. 7A, respectively, and forming a first copper foil pattern layer 114*aa* and a second copper foil pattern layer 114*ba*.

The forming of the first copper foil pattern layer 114*aa* and the second copper foil pattern layer 114*ba* may include, for example, a coating process of coating a first dry film DF1 and a second dry film DF2 on the surfaces of the first coating foil layer 114*a* and the second coating foil layer 114*b*, respectively, an exposure process of projecting a circuit pattern designed in a exposure mask onto the first dry film DF1 and the second dry film DF2, a development process of removing the first dry film DF1 and the second dry film DF2 in response to the light from the exposure process, and an etching process of removing the first copper foil layer 114*a* and the second copper foil layer 114*b* exposed by the removal of the first dry film DF1 and the second dry film DF2.

Figure 7C:
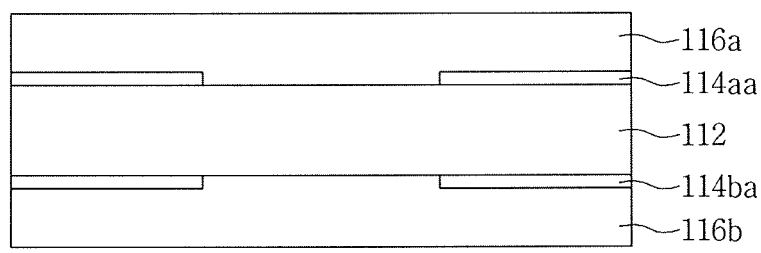

Referring to FIG. 7C, the method of manufacturing the PCB 110*a* according to the present embodiment of the inventive concept may include forming a first insulating adhesive sheet 116*a* and a second insulating adhesive sheet 116*b* attached to the first copper foil pattern layer 114*aa* and the second copper foil pattern layer 114*ba*, respectively.

The first insulating adhesive sheet 116*a* may be in contact with the exposed upper side of the first copper foil pattern layer 114*aa* and the insulating substrate 112, and the second insulating adhesive sheet 116*b* may be in contact with the exposed lower side of the second copper foil pattern layer 114*ba* and the insulating substrate 112.

The first insulating adhesive sheet 116*a* and the second insulating adhesive sheet 116*b* may include, for example, a prepreg. The prepreg may be, for example, an adhesive sheet of a B-stage.

Figure 7D:
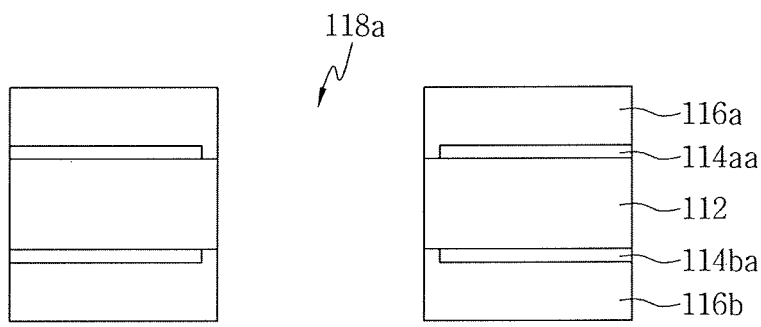

Referring to FIG. 7D, the method of manufacturing the PCB 110*a* according to the present embodiment of the inventive concept may include, for example, forming a single through hole 118*a* vertically penetrating the first insulating adhesive sheet 116*a*, the second insulating adhesive sheet 116*b*, and the insulating substrate 112.

The forming of the single through hole 118*a* may include, for example, a partial cutting process using a laser. The partial cutting process using the laser may include, for example, removing the first insulating adhesive sheet 116*a*, the insulating substrate 112, and the second insulating adhesive sheet 116*b* to have a predetermined shape using the laser. The portion from which the first insulating adhesive sheet 116*a*, the insulating substrate 112, and the second insulating adhesive sheet 116*b* are removed may not include the first copper foil pattern layer 114*aa* and the second copper foil pattern layer 114*ba*.

Figure 7E:
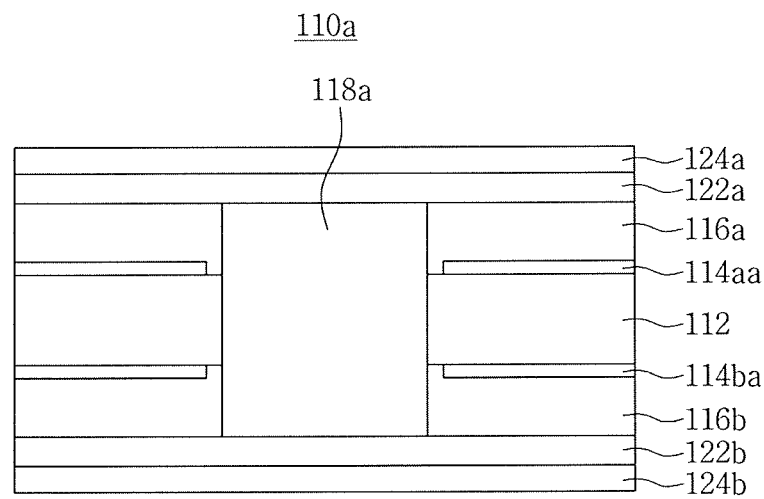

Referring to FIG. 7E, the method of manufacturing the PCB 110*a* according to the present embodiment of the inventive concept may include, for example, stacking a first insulating layer 122*a* and a third copper foil layer 124*a* on an upper side of the first insulating adhesive sheet 116*a*, and stacking a second insulating layer 122*b* and a fourth copper foil layer 124*b* on a lower side of the second insulating adhesive sheet 116.

The first insulating layer 122*a* and the second insulating layer 122*b* may include, for example, a prepreg and a polyimide film. If the first insulating layer 122*a* and the second insulating layer 122*b* are the prepreg, the third copper layer 124*a* and the fourth copper layer 124*b* may bond to the first insulating layer 122*a* and the second insulating layer 122*b* by, for example, a heating and pressurizing process.

For example, if the first insulating layer 122*a* and the second insulating layer 122*b* are the polyimide film, the first insulating layer 122*a* and the third copper foil layer 124*a* may be integrally formed, and the second insulating layer 122*b* and the fourth copper foil layer 124*b* may be integrally formed. At this time, the first insulating layer 122*a* and the second insulating layer 122*b* may be attached to the first insulating adhesive sheet 116*a* and the second insulating adhesive sheet 116*b*, respectively, through, for example, an individual adhesive.

For example, at this time, air whose dielectric constant is 1 may be filled inside the single through hole 118*a*.

Figure 7F:
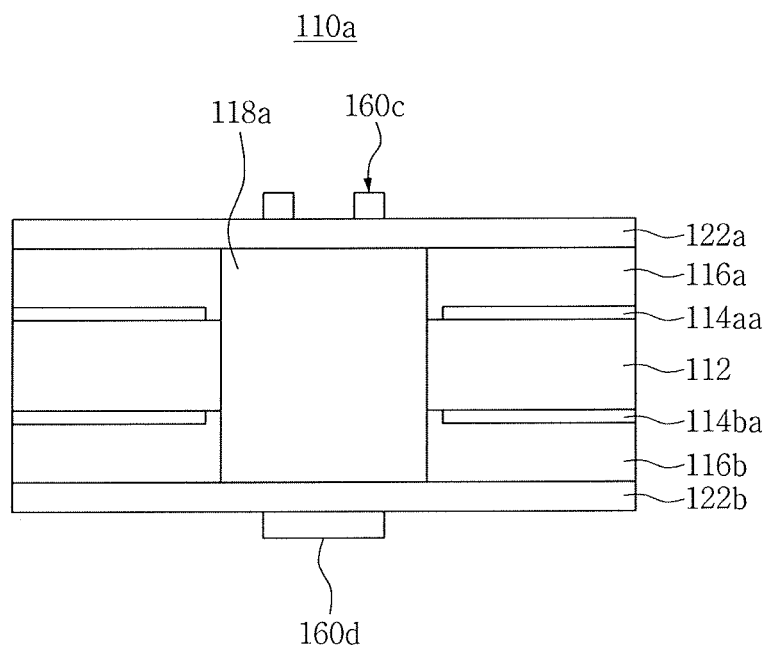

Referring to FIG. 7F, FIG. 1A, and FIG. 1B, the method of manufacturing the PCB 110*a* according to the present embodiment of the inventive concept may include, for example, patterning a third copper foil layer 124*a* and a fourth copper foil layer 124*b* of FIG. 7E, respectively, and forming a third copper foil pattern layer 124*aa* and the fourth copper foil pattern layer 124*ba*.

The third copper foil pattern layer 124*aa* may include, for example, a plurality of upper lands 160*a*, a signal line, and an inductor 160c, and the fourth copper foil pattern layer 124ba may include lower lands 160b and a grounding element 160d.

The inductor 160c may include, for example, a body B having a horseshoe shape, a first connection terminal CT1 which is one end of the body B, and a second connection terminal CT2 which is the other end of the body B. The grounding element 160d may have, for example, the same shape as the inductor 160c, or a plate shape. The through hole 118a may be located between the inductor 160c and the grounding element 160d.

The forming of the third copper foil pattern layer 124aa and the fourth copper foil pattern layer 124ba may include, for example, the exposure process, the development process, and the etching process explained with reference to FIG. 7B.

Figure 7G:
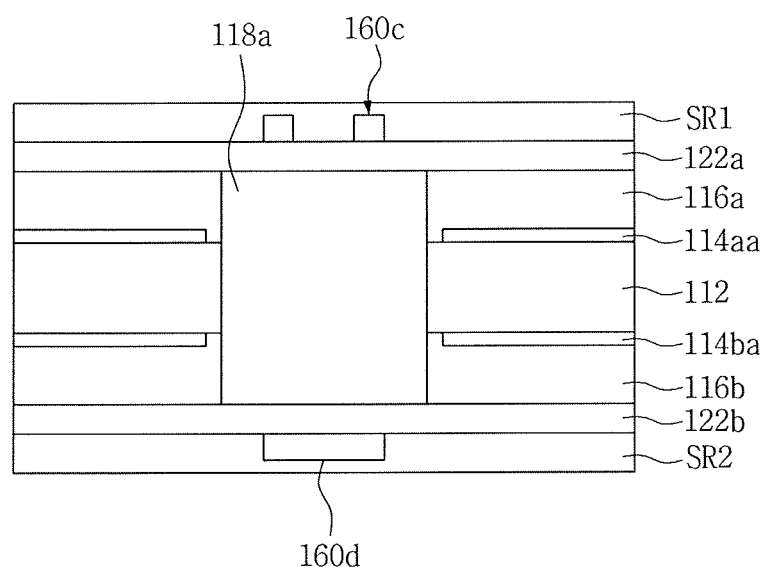

Referring to FIG. 7G and FIG. 1B, the method of manufacturing the PCB 110a according to the present embodiment of the inventive concept may include, for example, forming a first coating layer SR1 covering a third copper foil pattern layer 124aa including the inductor 160c, and a second coating layer SR2 covering a fourth copper foil pattern layer 124ba including the grounding element 160d. The forming of the first coating layer SR1 and the second coating layer SR2 may include, for example, exposing and developing the first coating layer SR1 and the second coating layer SR2.

For example, by the development process, the first coating layer SR1 may be partially removed and upper lands 160a may be exposed, and the second coating layer SR2 may be partially removed and lower lands 160b may be exposed.

FIG. 8A to FIG. 8D are sectional views illustrating a method of manufacturing the PCB according to an embodiment of the inventive concept. A process of FIG. 8A may include the processes of FIG. 7A to FIG. 7C, and will be explained briefly. A description of the method of manufacturing the PCB according to an embodiment of the inventive concept will be explained with further reference to FIG. 1A and FIG. 1B hereinafter.

Figure 8A:
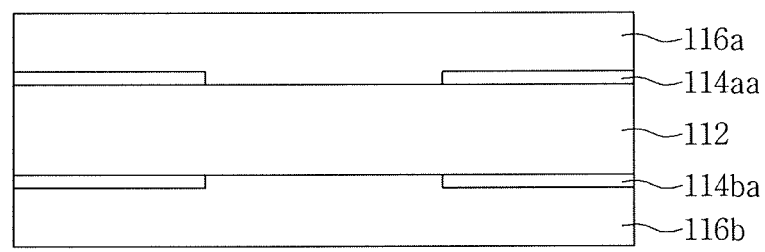
FIG. 8A to FIG. 8D are sectional views illustrating a method of manufacturing a PCB according to an embodiment of the inventive concept.

Referring to FIG. 8A, the method of manufacturing the PCB 110b according to the present embodiment of the inventive concept may include, for example, forming a first copper foil pattern layer 114aa and a second copper foil pattern layer 114ba on an upper side and a lower side of an insulating substrate 112, respectively.

In addition, the method of manufacturing the PCB 110b may further include, for example, forming a first insulating adhesive sheet 116a on an upper side of the first copper foil pattern layer 114aa, and a second insulating adhesive sheet 116b on a lower side of the second copper foil pattern layer 114ba.

Figure 8B:
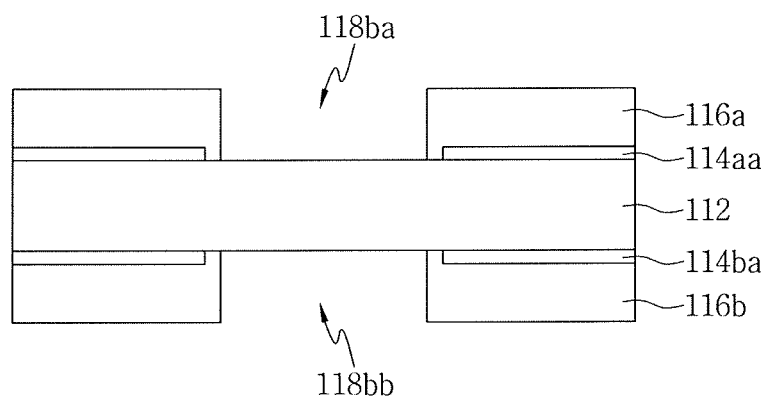

Referring to FIG. 8B, the method of manufacturing the PCB 110b according to the present embodiment of the inventive concept may include, for example, forming a first through hole 118ba and a second through hole 118bb penetrating the first insulating adhesive sheet 116a and the second insulating adhesive sheet 116b, respectively.

A portion of an upper side of the insulating substrate 112 may be exposed through the first through hole 118ba, and a portion of a lower side of the insulating substrate 112 may be exposed through the second through hole 118bb.

The forming of the first through hole 118ba and the second through hole 118bb may include, for example, a partial cutting process using a laser. The partial cutting process using the laser may include, for example, partially removing the first insulating adhesive sheet 116a and the second insulating adhesive sheet 116b to have a predetermined shape by transmitting the laser to a substrate.

Figure 8C:
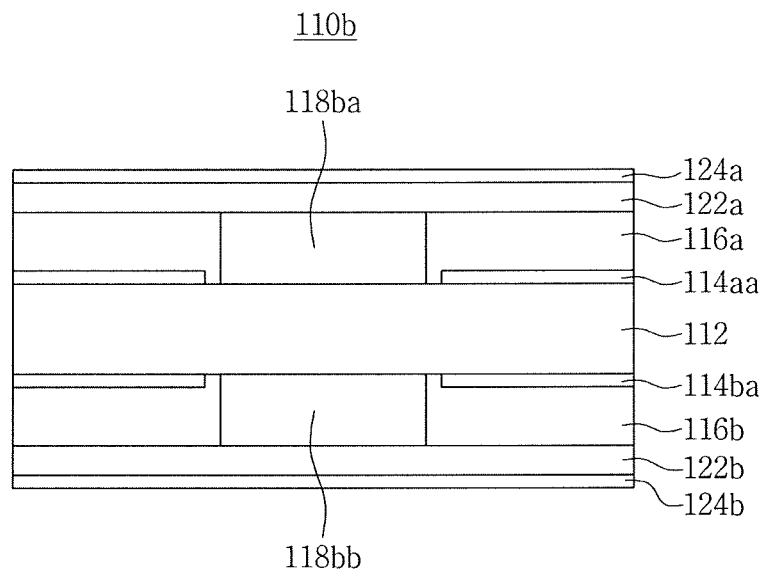

Referring to FIG. 8C, the method of manufacturing the PCB 110b according to the present embodiment of the inventive concept may include, for example, stacking a first insulating layer 122a and a third copper foil layer 124a on an upper side of the first insulating adhesive sheet 116a including the first through hole 118ba, and stacking a second insulating layer 122b and a fourth copper foil layer 124b on a lower side of the second insulating adhesive sheet 116b including the second through hole 118bb.

The first insulating layer 122a may be in contact with the upper side of the first insulating adhesive sheet 116a, and the second insulating layer 122b may be in contact with the lower side of the second insulating adhesive sheet 116b.

For example, at this time, air whose dielectric constant is 1 may be filled inside the first and second through holes 118ba and 118bb.

Figure 8D:
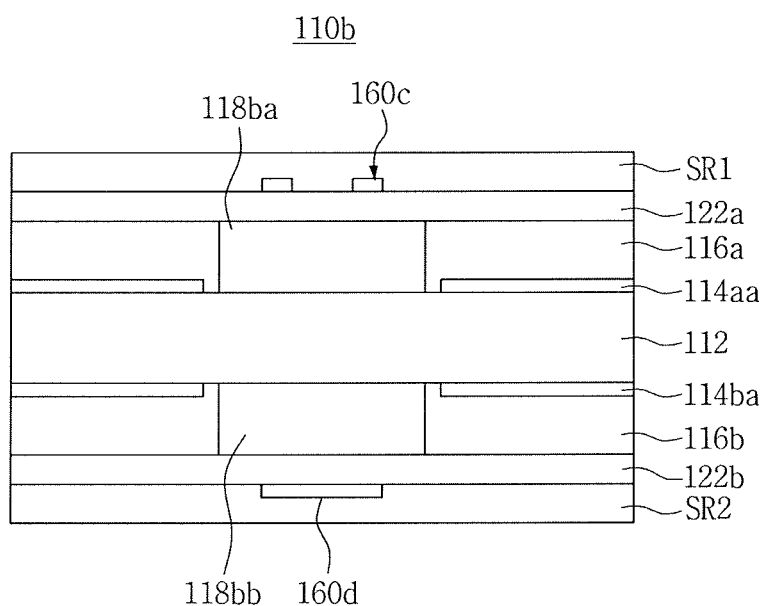

Referring to FIG. 8D and FIG. 1B, the method of manufacturing the PCB 110b according to the present embodiment of the inventive concept may include, for example, forming a third copper foil pattern layer 124aa and a first coating layer SR1 on an upper side of the first insulating layer 122a, and forming a fourth copper foil pattern layer 124ba and a second coating layer SR2 on a lower side of the second insulating layer 122b.

The third copper foil pattern layer 124aa may include, for example, a plurality of upper lands 160a, a signal line, and an inductor 160c, and the fourth copper foil pattern layer 124ba may include lower lands 160b and a grounding element 160d.

The first through hole 118ba and the second through hole 118bb may be located between the inductor 160c and the grounding element 160d.

FIG. 9A to FIG. 9D are sectional views illustrating a method of manufacturing the PCB according to an embodiment of the inventive concept. A process of FIG. 9A may include the processes of FIG. 7A to FIG. 7D, and will be explained briefly. A description of the method of manufacturing the PCB according to an embodiment of the inventive concept will be explained with further reference to FIG. 1A and FIG. 1B hereinafter.

Figure 9A:
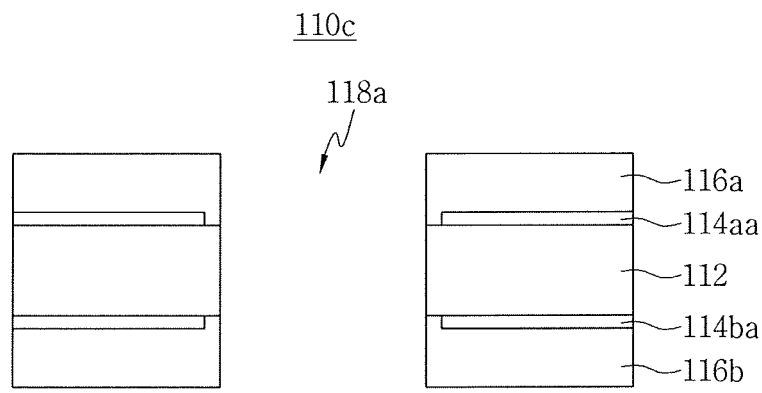
FIG. 9A to FIG. 9D are sectional views illustrating a method of manufacturing a PCB according to an embodiment of the inventive concept.

Referring to FIG. 9A, the method of manufacturing the PCB 110c according to the present embodiment of the inventive concept may include, for example, forming a first insulating adhesive sheet 116a on an upper side of a first copper foil pattern layer 114aa, and forming a second insulating adhesive sheet 116b on a lower side of a second copper foil pattern layer 114ba.

In addition, the method of manufacturing the PCB 110c may further include, for example, forming a single through hole 118a penetrating a first insulating adhesive sheet 116a, an insulating substrate 112, and a second insulating adhesive sheet 116b.

Figure 9B:
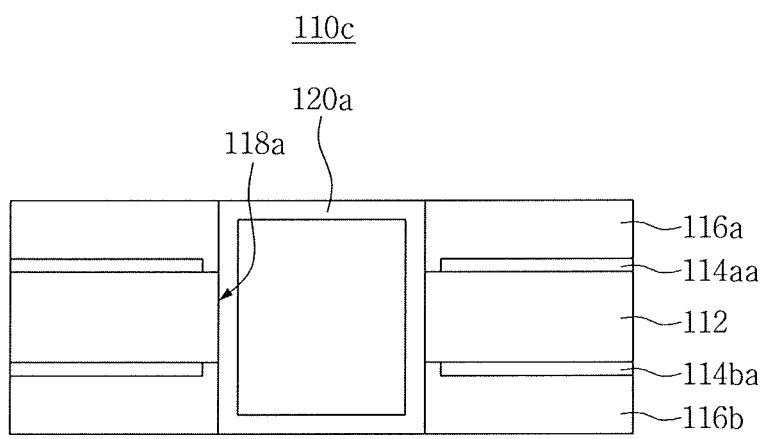

Referring to FIG. 9B, the method of manufacturing the PCB 110c according to the present embodiment of the inventive concept may include, for example, forming a single hollow dielectric 120a filling the single through hole 118a.

An upper side of the single hollow dielectric 120a may be, for example, at a same level or a lower level than an upper side of the first insulating adhesive sheet 116a. A lower side of the single hollow dielectric 120a may be, for example, at a same level or a lower level than a lower side of the second insulating adhesive sheet 116b.

The single hollow dielectric 120a may be, for example, moldable to have a desirable shape and include a low dielectric material whose dielectric constant is lower than about 4.3. The low dielectric material may include, for example, a Teflon resin, a polyimide resin, an epoxy resin, and a silicone resin.

Figure 9C:
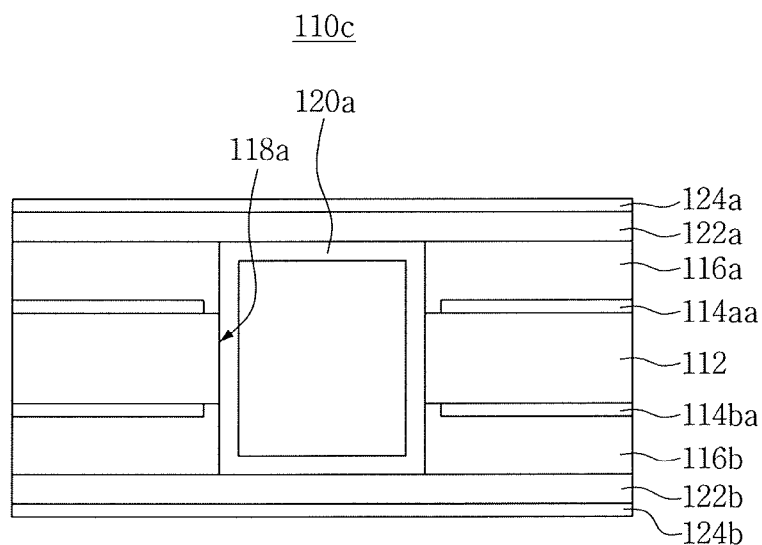

Referring to FIG. 9C, the method of manufacturing the PCB 110c according to the present embodiment of the inventive concept may include, for example, stacking a first insulating layer 122a and a third copper foil layer 124a on upper sides of the first insulating adhesive sheet 116a and the single hollow dielectric 120a, and stacking a second insulating layer 122b and a fourth copper foil layer 124b on lower sides of the second insulating adhesive sheet 116b and the single hollow dielectric 120a.

The first insulating layer 122a and the second insulating layer 122b may include, for example, a prepreg and a polyimide film.

Figure 9D:
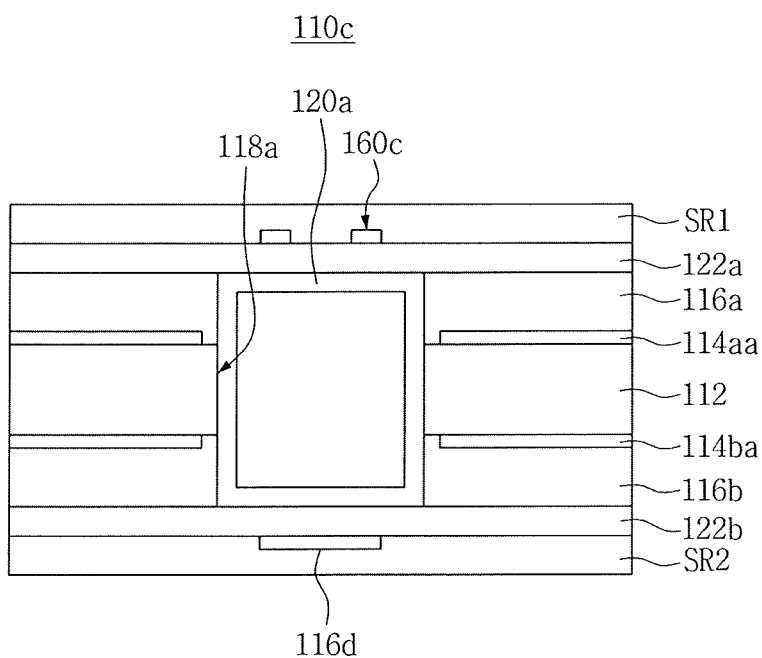

Referring to FIG. 9D and FIG. 1B, the method of manufacturing the PCB 110c according to the present embodiment of the inventive concept may include, for example, forming a third copper foil pattern layer 124aa and a first coating layer SR1 on an upper side of the first insulating layer 122a, and forming a fourth copper foil pattern layer 124ba and a second coating layer SR2 on a lower side of the second insulating layer 122b.

The third copper foil pattern layer 124aa may include, for example, a plurality of upper lands 160a, a signal line, and an inductor 160c, and the fourth copper foil pattern layer 124ba may include lower lands 160b and a grounding element 160d.

The single hollow dielectric 120a may be located between the inductor 160c and the grounding element 160d.

FIG. 10A to FIG. 10D are sectional views illustrating a method of manufacturing the PCB according to an embodiment of the inventive concept. A process of FIG. 10A may include the processes of FIG. 8A and FIG. 8B, and will be explained briefly. A description of the method of manufacturing the PCB according to an embodiment of the inventive concept will be explained with further reference to FIG. 1B hereinafter.

Figure 10A:
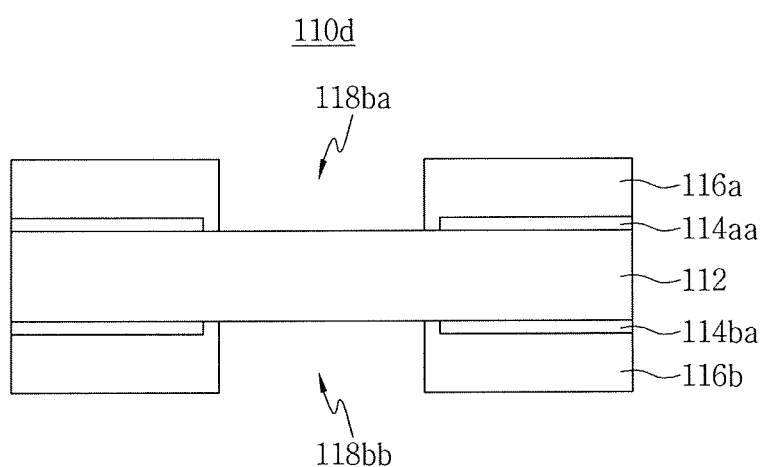
FIG. 10A to FIG. 10D are sectional views illustrating a method of manufacturing a PCB according to an embodiment of the inventive concept.

Referring to FIG. 10A, the method of manufacturing the PCB 110d according to the present embodiment of the inventive concept may include, for example, forming a first copper foil pattern layer 114aa and a second copper foil pattern layer 114ba on an upper side and a lower side of an insulating substrate 112.

In addition, the method of manufacturing the PCB 110d may further include, for example, forming a first insulating adhesive sheet 116a on an upper side of the first copper foil pattern layer 114aa and a second insulating adhesive sheet 116b on a lower side of the second copper foil pattern layer 114ba.

The method of manufacturing the PCB 110d according to the present embodiment of the inventive concept may include, for example, forming a first through hole 118ba and a second through hole 118bb penetrating the first insulating adhesive sheet 116a and the second insulating adhesive sheet 116b, respectively.

Figure 10B:
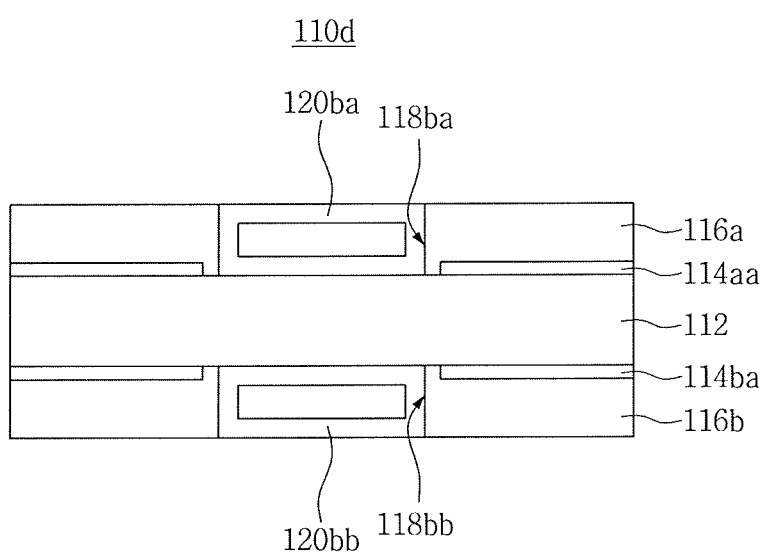

Referring to FIG. 10B, the method of manufacturing the PCB 110d according to the present embodiment of the inventive concept may include, for example, forming a first hollow dielectric 120ba and a second hollow dielectric 120bb inside the first through hole 118ba and the second through hole 118bb.

An upper side of the first hollow dielectric 120ba may be, for example, at a same level or a lower level than an upper side of the first insulating adhesive sheet 116a. A lower side of the second hollow dielectric 120bb may be, for example, at a same level or a lower level than a lower side of the second insulating adhesive sheet 116b.

The first hollow dielectric 120ba and the second hollow dielectric 120bb may be, for example, moldable to have a desirable shape and include a low dielectric material whose dielectric constant is lower than about 4.3. The low dielectric material may include, for example, a Teflon resin, a polyimide resin, an epoxy resin, and a silicone resin.

Figure 10C:
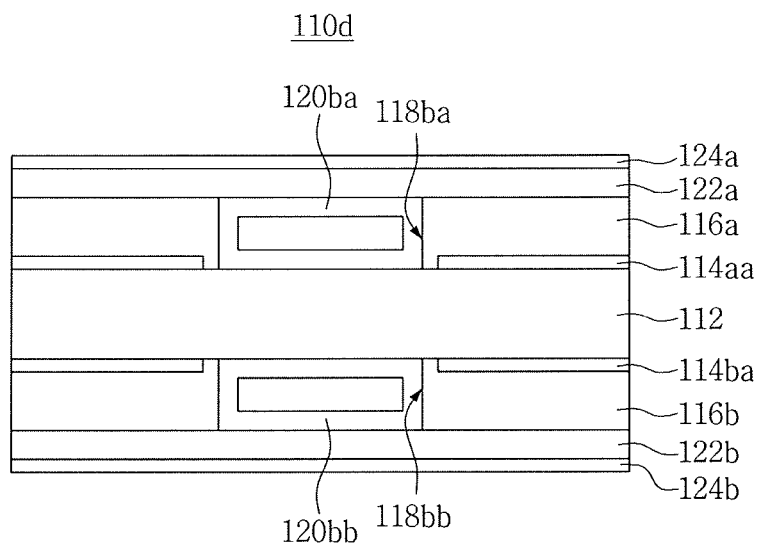

Referring to FIG. 10C, the method of manufacturing the PCB 110d according to the present embodiment of the inventive concept may include, for example, stacking a first insulating layer 122a and a third copper foil layer 124a on an upper side of the first insulating adhesive sheet 116a and the first hollow dielectric 120ba, and stacking a second insulating layer 122b and a fourth copper foil layer 124b on a lower side of the second insulating adhesive sheet 116b and the second hollow dielectric 120bb.

Figure 10D:
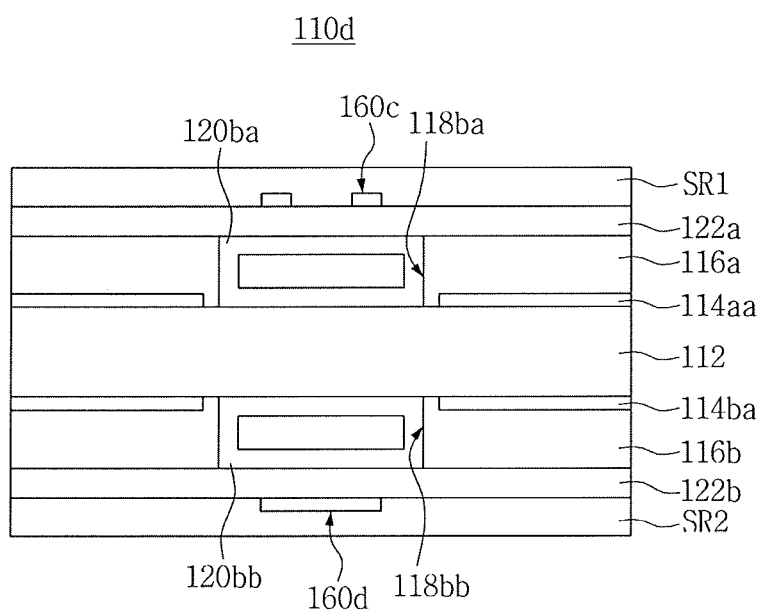

Referring to FIG. 10D and FIG. 1B, the method of manufacturing the PCB 110d according to the present embodiment of the inventive concept may include, for example, forming a third copper foil pattern layer 124aa and a first coating layer SR1 on an upper side of the first insulating layer 122a, and forming a fourth copper foil pattern layer 124ba and a second coating layer SR2 on a lower side of the second insulating layer 122b.

The third copper foil pattern layer 124aa may include, for example, a plurality of upper lands 160a, a signal line, and an inductor 160c, and the fourth copper foil pattern layer 124ba may include lower lands 160b and a grounding element 160d.

The first hollow dielectric 120ba and the second hollow dielectric 120bb may be located between the inductor 160c and the grounding element 160d.

Figure 11A:
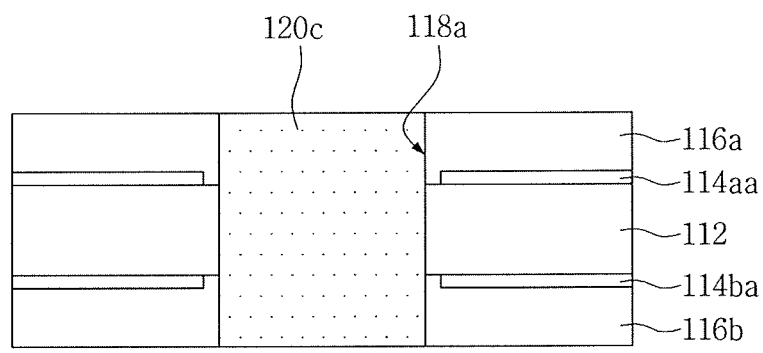
FIG. 11A to FIG. 11B are sectional views illustrating a method of manufacturing a PCB according to an embodiment of the inventive concept.
Figure 11B:
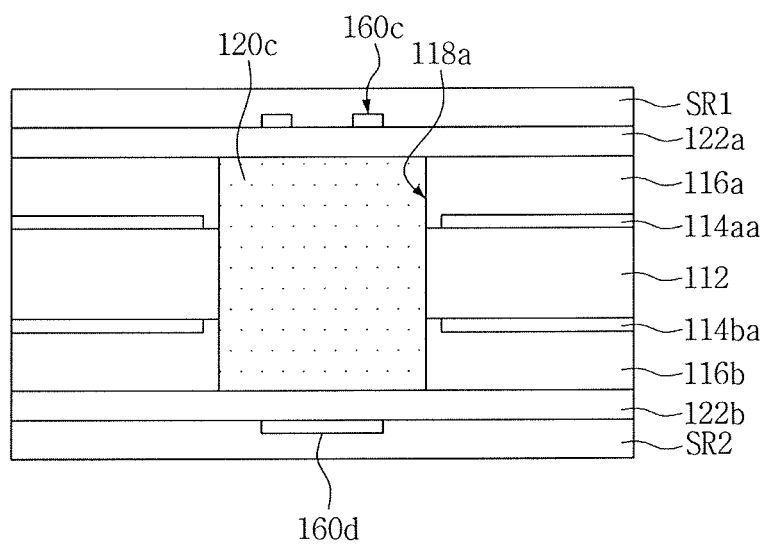

FIG. 11A and FIG. 11B are sectional views illustrating a method of manufacturing the PCB according to an embodiment of the inventive concept. Processes of FIG. 11A and FIG. 11B may include the processes of FIG. 7A and FIG. 7D, and will be explained briefly. A description of the method of manufacturing the PCB according to an embodiment of the inventive concept will be explained with further reference to FIG. 1B hereinafter.

Referring to FIG. 11A, the method of manufacturing the PCB 110e according to the present embodiment of the inventive concept may include, for example, forming a single through hole 118a penetrating an insulating substrate 112, a first insulating adhesive sheet 116a, and a second insulating adhesive sheet 116b, and forming a single dielectric 120c filling the single through hole 118a.

An upper side of the single dielectric 120c may be, for example, at a same level or a lower level than an upper side of the first insulating adhesive sheet 116a. A lower side of the single dielectric 120c may be, for example, at a same level or a lower level than a lower side of the second insulating adhesive sheet 116b.

The single dielectric 120c may be, for example, moldable to have a desirable shape and include a low dielectric material whose dielectric constant is lower than about 4.3. The low dielectric material may include, for example, a Teflon resin, a polyimide resin, an epoxy resin, and a silicone resin.

Referring to FIG. 11B and FIG. 1B, the method of manufacturing the PCB 110e according to the present embodiment of the inventive concept may include, for example, forming a first insulating layer 122a and a third copper foil pattern layer 124aa on upper sides of the first insulating adhesive sheet 116a and the single dielectric 120c, and forming a second insulating layer 122b and a fourth copper foil pattern layer 124ba on lower sides of the second insulating adhesive sheet 116b and the single dielectric 120c.

The method of manufacturing the PCB 110e according to an embodiment of the inventive concept may further include, for example, forming a first coating layer SR1 on an upper side of the third copper foil pattern layer 124aa, and forming a second coating layer SR2 on a lower side of the fourth copper foil pattern layer 124ba.

The third copper foil pattern layer 124aa may include, for example, a plurality of upper lands 160a, a signal line, and an inductor 160c, and the fourth copper foil pattern layer 124ba may include lower lands 160b and a grounding element 160d.

The single dielectric 120c may be located between the inductor 160c and the grounding element 160d.

Figure 12A:
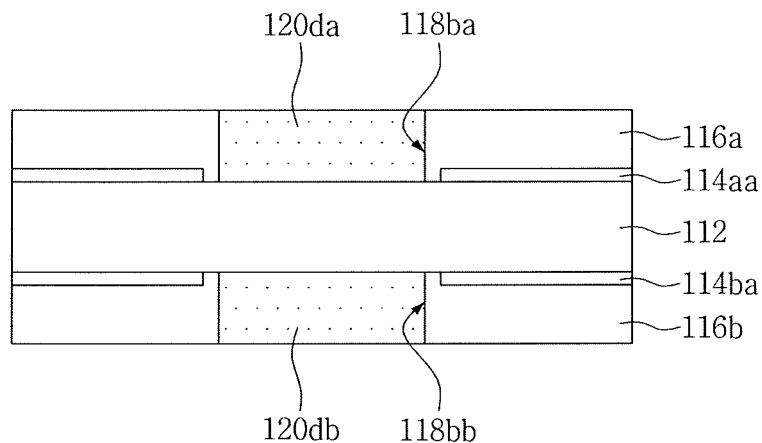
FIG. 12A to FIG. 12B are sectional views illustrating a method of manufacturing a PCB according to an embodiment of the inventive concept.
Figure 12B:
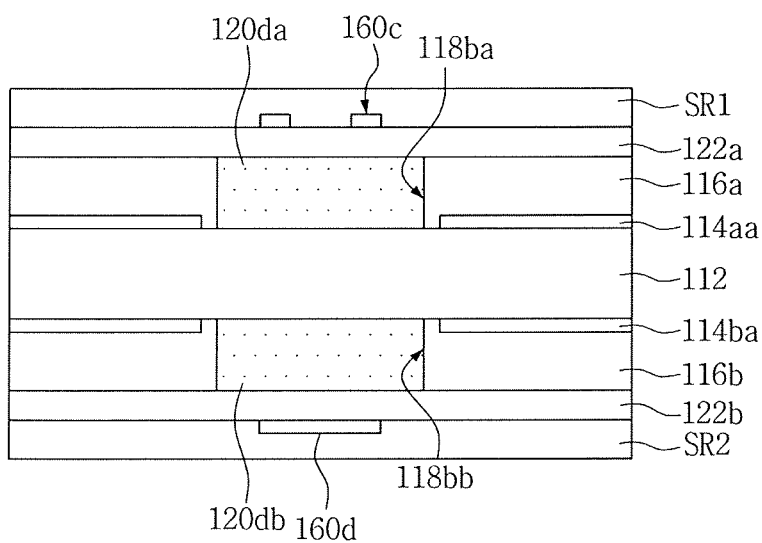

FIG. 12A and FIG. 12B are sectional views illustrating a method of manufacturing the PCB according to an embodiment of the inventive concept. Processes of FIG. 12A and FIG. 12B may include the processes of FIG. 8A and FIG. 8B, and will be explained briefly. A description of the method of manufacturing the PCB according to an embodiment of the inventive concept will be explained with further reference to FIG. 1B hereinafter.

Referring to FIG. 12A, the method of manufacturing the PCB 110f according to the present embodiment of the inventive concept may include, for example, forming a first dielectric 120da inside a first through hole 118ba formed in a first insulating adhesive sheet 116a, and forming a second dielectric 120db inside a second through hole 118bb formed in a second insulating adhesive sheet 116b.

The first dielectric 120da and the second dielectric 120db may be, for example, moldable to have a desirable shape and include a low dielectric material whose dielectric constant is lower than about 4.3. The low dielectric material may include, for example, a Teflon resin, a polyimide resin, an epoxy resin, and a silicone resin.

Referring to FIG. 12B and FIG. 1B, the method of manufacturing the PCB 110f according to the present embodiment of the inventive concept may include, for example, forming a first insulating layer 122a and a third copper foil pattern layer 124aa on upper sides of the first dielectric 120da and the first insulating adhesive sheet 116a, and forming a second insulating layer 122b and a fourth copper foil pattern layer 124ba on lower sides of the second dielectric 120db and the second insulating adhesive sheet 116b.

The method of manufacturing the PCB 110f according to the present embodiment of the inventive concept may further include, for example, forming a first coating layer SR1 on an upper side of the third copper foil pattern layer 124aa, and forming a second coating layer SR2 on a lower side of the fourth copper foil pattern layer 124ba.

The third copper foil pattern layer 124aa may include, for example, a plurality of upper lands 160a, a signal line, and an inductor 160c, and the fourth copper foil pattern layer 124ba may include lower lands 160b and a grounding element 160d.

The first dielectric 120da and the second dielectric 120db may be located between the inductor 160c and the grounding element 160d.

Figure 13:
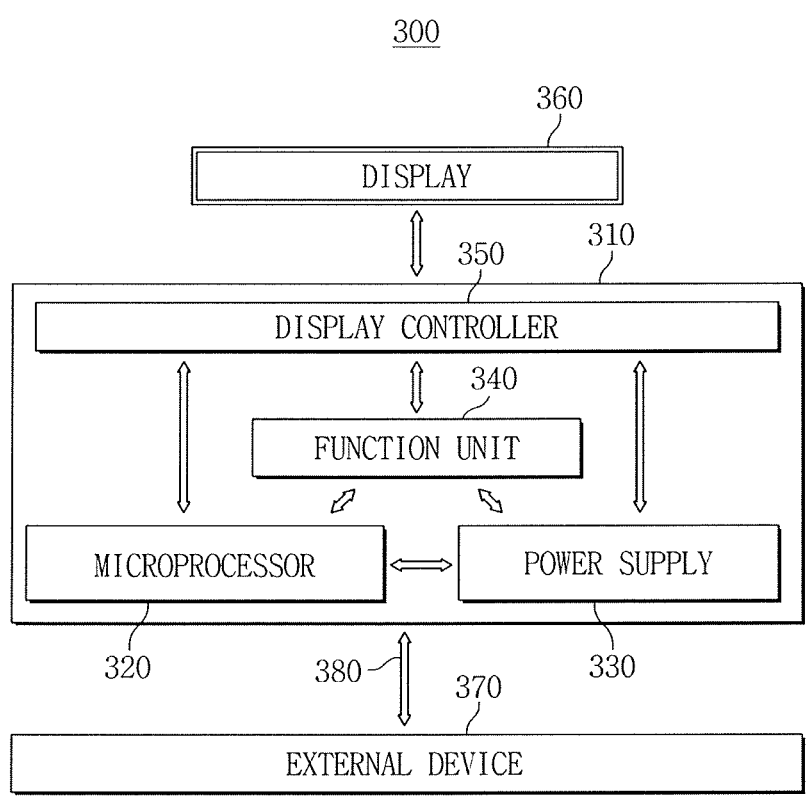
FIG. 13 is a conceptual block diagram illustrating an electronic system on which a semiconductor package including at least one PCB according to an embodiment of the inventive concept is mounted.

FIG. 13 is a conceptual block diagram illustrating an electronic system on which a semiconductor package including at least one PCB according to an embodiment of the inventive concept is mounted.

Referring to FIG. 13, at least one of semiconductor packages including PCBs 110a, 110b, 110c, 110d, 110e, and 110f according to an embodiment of the inventive concept may be applied to an electronic system 300.

The electronic system 300 may include, for example, a body 310, a microprocessor 320, a power supply unit 330, a function unit 340, and a display controller 350. The body 310 may be, for example, a system board or a mother board which has a printed circuit board, etc. The microprocessor 320, the power supply unit 330, the function unit 340, and the display controller 350 may be mounted on the body 310. A display unit 360 may be arranged on an upper side of or outside the body 310. For example, the display unit 360 may be arranged on the surface of the body 310, and display an image processed by the display controller 350. The power supply unit 330 may receive a constant voltage from an external power supply, etc., divide the constant voltage into various voltage levels, and supply the various voltage levels to the microprocessor 320, the function unit 340, the display controller 350, etc. The microprocessor 320 may receive a voltage from the power supply unit 330 to control the function unit 340 and the display unit 360. The function unit 340 may perform various functions of the electronic system 300. For example, when the electronic system 300 is a mobile electronic product, such as a portable phone, the function unit 340 may include several elements capable of wireless communication functions, such as output of an image to the display unit 360 or output of a voice to a speaker, by dialing or communication with an external device 370. When the function unit 340 includes a camera, the function unit 340 may serve as an image processor. In an embodiment, when the electronic system 300 is connected to a memory card to increase capacity, the function unit 340 may be, for example, a memory card controller. The function unit 340 may transmit and receive signals to/from the external device 370 through a wired or wireless communication unit 380. In addition, when the electronic system 300 needs a universal serial bus (USB) to expand functions thereof, the function unit 340 may serve as, for example, an interface controller.

At least one of semiconductor packages according to an embodiment of the inventive concept may be included in at least one of the microprocessor 320 or the function unit 340.

Figure 14:
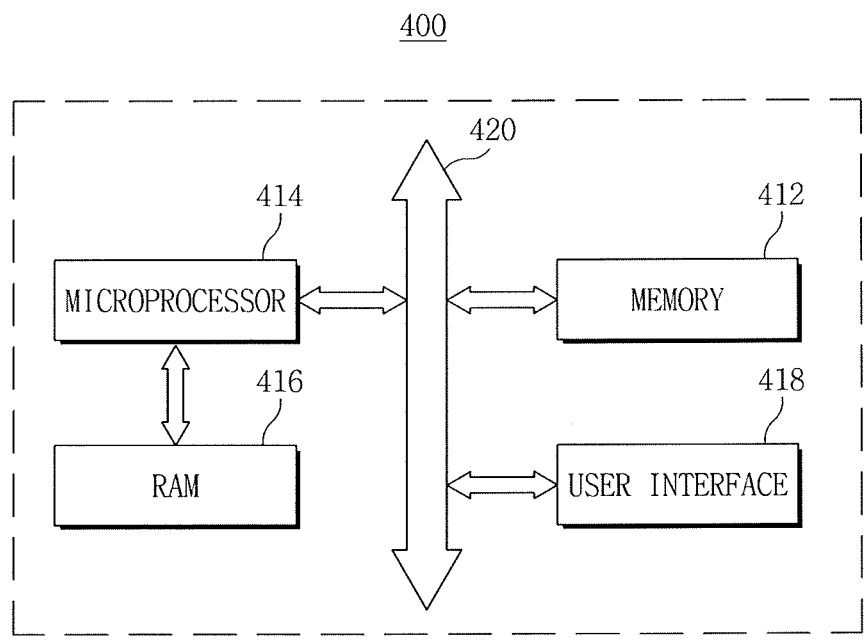
FIG. 14 is a conceptual block diagram illustrating an electronic system on which a semiconductor package including at least one PCB according to an embodiment of the inventive concept is mounted.

FIG. 14 is a conceptual block diagram illustrating an electronic system on which a semiconductor package including at least one PCB according to an embodiment of the inventive concept is mounted.

Referring to FIG. 14, at least one of semiconductor packages including the PCBs 110a, 110b, 110c, 110d, 110e, and 110f according to an embodiment of the inventive concept may be applied to an electronic system 400.

The electronic system 400 may be included in, for example, a mobile apparatus or computer. For example, the electronic system 400 may include a memory system 412, a microprocessor 414, a random access memory (RAM) 416, and a user interface 418, which may communicate data using a bus 420. The microprocessor 414 may program and control the electronic system 400.

The microprocessor 414, the RAM 416, and/or other elements may be assembled within a single package. The user interface 418 may be used to input data to the electronic system 400 or output data from the electronic system 400. The memory system 412 may store codes for operating the microprocessor 414, data processed by the microprocessor 414, or external input data. The memory system 412 may include, for example, a controller and a memory.

Figure 15:
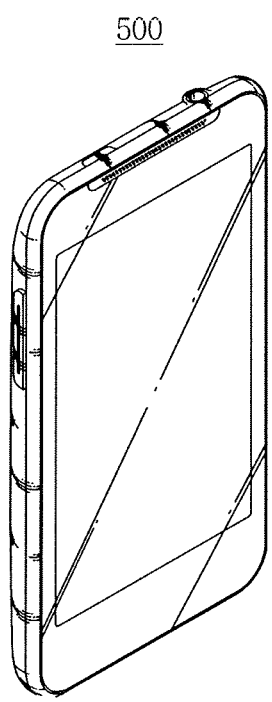
FIG. 15 is a conceptual block diagram illustrating a mobile wireless phone on which a semiconductor package including at least one PCB according to an embodiment of the inventive concept is mounted.

FIG. 15 is a conceptual block diagram illustrating a mobile wireless phone on which a semiconductor package including at least one PCB according to an embodiment of the inventive concept is mounted. The mobile wireless phone 500 may be interpreted as, for example, a tablet personal computer (PC). Furthermore, a semiconductor package including the PCBs 110a, 110b, 110c, 110d, 110e, 110f according to an embodiment of the inventive concept may be used not only for a tablet PC but, for example, also for a portable computer such as a laptop computer, an MPEG-1 audio layer 3 (MP3) player, an MP4 player, a navigation device, a solid-state disk (SSD), a desktop computer, or electronic devices for automotive and household uses.

A PCB according to an embodiment of the inventive concept may increase a Q-value of the inductor by constituting a low dielectric material whose dielectric constant is lower than about 4.3 between the inductor and a grounding element (e.g., a conductive plate).

As the Q-value is increased, the inductor may have a pure inductor component, thereby increasing the performance of the inductor.

A PCB according to embodiments of the inventive concept may include the inductor, thereby decreasing a size of a semiconductor chip mounted on the PCB.

A PCB according to embodiments of the inventive concept may decrease a parasitic capacitance, and thus increase characteristics of the inductor. Accordingly, a system including a semiconductor chip and the PCB may operate stably.

Having described exemplary embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A printed circuit board (PCB) comprising:
an insulating substrate;
a plurality of copper foil pattern layers and a plurality of insulating adhesive sheets sequentially stacked on an upper side of the insulating substrate and a lower side of the insulating substrate;
an inductor included in the copper foil pattern layer disposed on the upper side of the insulating substrate;
a grounding element included in the copper foil pattern layer disposed on the lower side of the insulating substrate; and
a through hole penetrating the insulating substrate and the insulating adhesive sheets,
wherein the through hole is disposed between the inductor and the grounding element,
wherein the through hole is not filled with a conductive material, and the through hole is disposed directly under the inductor and directly and entirely over the grounding element.

2. The PCB according to claim 1, wherein the inductor comprises a body having a horseshoe shape, a first connection terminal which is a first end of the body, and a second connection terminal which is a second end of the body.

3. The PCB according to claim 1, wherein the through hole is filled with air.

4. The PCB according to claim 1, further comprising: a single hollow dielectric filling the through hole, and being hollow therein.

5. The PCB according to claim 1, further comprising: a single dielectric filling the through hole.

6. The PCB according to claim 1, wherein the insulating substrate and the insulating adhesive sheets include a prepreg.

7. The PCB according to claim 1, further comprising: a first insulating layer disposed between the grounding element and the through hole, and a second insulating layer disposed between the inductor and the through hole.

8. The PCB according to claim 1, further comprising a first coating layer covering the copper foil pattern layer including the inductor disposed on the upper side of the insulating substrate and a second coating layer covering the copper foil pattern layer including the grounding element disposed on the lower side of the insulating substrate.

9. The PCB according to claim 4, wherein the single hollow dielectric is a low dielectric material including at least one of a polyimide resin, a Teflon resin, and a silicone resin, and wherein the low dielectric material has a dielectric constant lower than about 4.3.

10. The PCB according to claim 5, wherein the single dielectric is a low dielectric material including at least one of a polyimide resin, a Teflon resin, and a silicone resin, and wherein the low dielectric material has a dielectric constant lower than about 4.3.

11. The PCB according to claim 6, wherein the prepreg includes a reinforcing fiber and a thermosetting resin.

12. The PCB according to claim 7, wherein the first insulating layer or the second insulating layer includes a prepreg and a polyimide film.

13. A printed circuit board (PCB) comprising:
an insulating substrate;
a plurality of copper foil pattern layers and a plurality of insulating adhesive sheets sequentially stacked on an upper side of the insulating substrate and a lower side of the insulating substrate;
an inductor included in the copper foil pattern layer disposed on the upper side of the insulating substrate;
a grounding element included in the copper foil pattern layer disposed on the lower side of the insulating substrate;
a first through hole penetrating a first insulating adhesive sheet disposed directly under the inductor; and
a second through hole penetrating a second insulating adhesive sheet disposed directly and entirely over the grounding element,
wherein the first through hole and the second through hole are disposed between the inductor and the grounding element, and
wherein the first through hole is spaced apart, from the second through hole by the insulating substrate.

14. The PCB according to claim 13, further comprising:
a first hollow dielectric filling the first through hole and having a dielectric constant lower than about 4.3; and
a second hollow dielectric filling the second through hole and having the dielectric constant lower than about 4.3.

15. The PCB according to claim 13, further comprising:
a first dielectric filling the first through hole and having a dielectric constant lower than about 4.3; and
a second dielectric filling the second through hole and having the dielectric constant lower than about 4.3.

16. The PCB according to claim 13, further comprising a first coating layer covering the copper foil pattern layer including the inductor disposed on the upper side of the insulating substrate and a second coating layer covering the copper foil pattern layer including the grounding element disposed on the lower side of the insulating substrate.

17. A semiconductor package comprising:
a printed circuit board (PCB);
a semiconductor chip mounted on an upper side of the PCB;

a plurality of chip bumps disposed on a lower side of the semiconductor chip;
a plurality of upper lands disposed on the upper side of the PCB;
a plurality of lower lands disposed on a lower side of the PCB; and
a plurality of solder balls disposed on the lower side of the PCB,
wherein the PCB comprises:
an insulating substrate,
a first copper foil pattern layer disposed on an upper side of the insulating substrate,
a second copper foil pattern layer disposed on a lower side of the insulating substrate, wherein the first copper foil pattern layer and the second copper foil pattern layer include a circuit line layer,
a first insulating adhesive sheet disposed on an upper surface of the first copper foil pattern layer,
a first insulating layer disposed on an upper surface of the first insulating adhesive sheet,
a third copper foil pattern layer disposed on an upper surface of the first insulating layer, wherein the third copper foil pattern layer includes the upper lands and an inductor,
a second insulating adhesive sheet disposed on a lower surface of the second copper foil pattern layer,
a second insulating layer disposed on a lower surface of the second insulating adhesive sheet,
a fourth copper foil pattern layer disposed on a lower surface of the second insulating layer, wherein the fourth copper foil pattern layer includes the lower lands and a grounding element,
a single through hole penetrating the insulating substrate and the first insulating adhesive sheet and the second insulating adhesive sheet, and wherein the single through hole is disposed between the inductor and the grounding element,
a first coating layer covering the third copper foil pattern layer, and
a second coating layer covering the fourth copper foil pattern layer.

18. The semiconductor package according to claim 17, wherein an interior of the single through hole is filled with air having a dielectric constant of about 1.

19. The semiconductor package according to claim 17, wherein the inductor comprises a body having a horseshoe shape, a first connection terminal which is one end of the body, and a second connection terminal which is another end of the body, wherein the first connection terminal and the second connection terminal of the inductor are electrically connected to the upper lands.

* * * * *